United States Patent
Prakash et al.

(10) Patent No.: US 11,644,494 B1
(45) Date of Patent: May 9, 2023

(54) PARAMETER ESTIMATION IN DRIVER CIRCUITRY

(71) Applicant: Cirrus Logic International Semiconductor Ltd., Edinburgh (GB)

(72) Inventors: Chandra B. Prakash, Austin, TX (US); Tejasvi Das, Austin, TX (US); Siddharth Maru, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 17/690,402

(22) Filed: Mar. 9, 2022

Related U.S. Application Data

(60) Provisional application No. 63/276,775, filed on Nov. 8, 2021.

(51) Int. Cl.
*H03K 5/24* (2006.01)
*G01R 27/16* (2006.01)

(52) U.S. Cl.
CPC .............. *G01R 27/16* (2013.01); *H03K 5/24* (2013.01)

(58) Field of Classification Search
CPC .......... H03F 1/52; H03F 3/217; H03F 1/0227; H03F 3/183; H03F 2200/03; H03M 1/12; H04R 3/007
USPC ...................................................... 327/108
See application file for complete search history.

(56) References Cited

U.S. PATENT DOCUMENTS

| | | | |
|---|---|---|---|
| 2013/0158921 A1 | 6/2013 | Shah et al. | |
| 2014/0126730 A1 | 5/2014 | Crawley et al. | |
| 2017/0111735 A1* | 4/2017 | Ego | H04R 3/00 |
| 2019/0260333 A1* | 8/2019 | Lindemann | G01R 27/2611 |
| 2021/0175852 A1* | 6/2021 | Clarkin | H03F 1/52 |
| 2021/0289295 A1* | 9/2021 | Wei | H03G 7/002 |

OTHER PUBLICATIONS

Search Report under Section 17, UKIPO, Application No. GB2213825.9, dated Mar. 13, 2023.

* cited by examiner

*Primary Examiner* — Quan Tra
(74) *Attorney, Agent, or Firm* — Jackson Walker L.L.P.

(57) ABSTRACT

Circuitry for driving a load, the circuitry comprising: driver circuitry; load sensing circuitry; and a parameter estimation engine, wherein the circuitry is operable in: a driving mode of operation in which the driver circuitry supplies a drive signal to a load coupled to the circuitry; and a load sensing mode of operation, for estimating a characteristic of a load coupled to the circuitry based on a signal output by the load sensing circuitry in response to a stimulus signal supplied to the driver circuitry, and wherein the circuitry is operable to perform a calibration operation in which the parameter estimation engine generates a circuit parameter for use in the load sensing mode based, at least in part, on a signal generated by the circuitry in response to a calibration stimulus signal supplied to the driver circuitry.

17 Claims, 3 Drawing Sheets

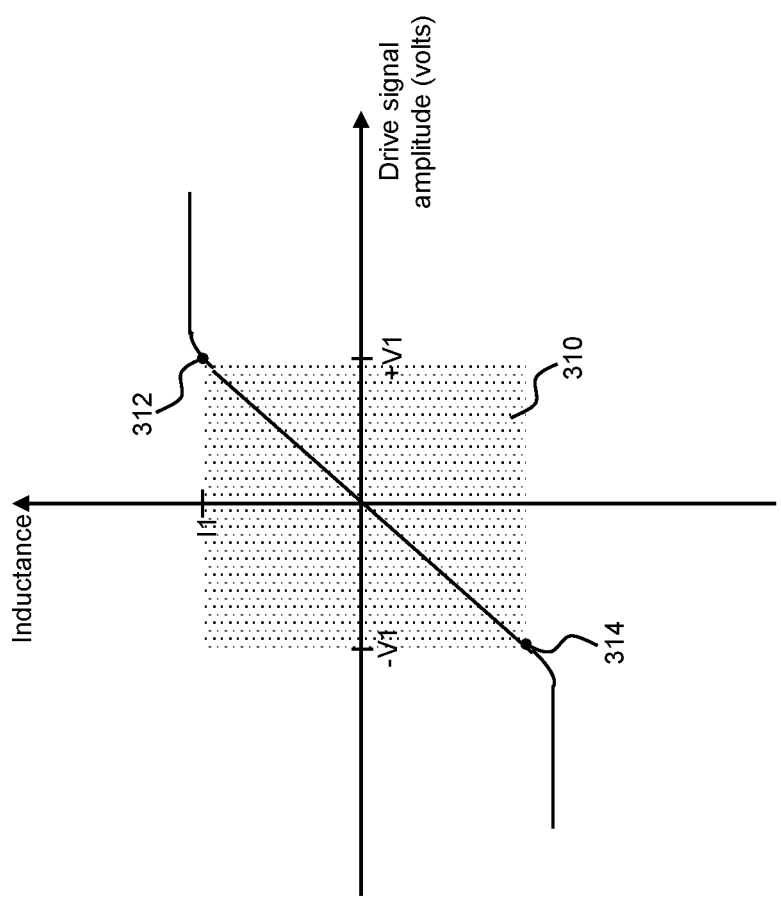

PARAMETER ESTIMATION IN DRIVER CIRCUITRY

FIELD OF THE INVENTION

The present disclosure relates to circuitry for driving a load, and in particular to circuitry that is operable to perform a self-calibration operation to generate a circuit parameter to be applied to an element of the circuitry when the circuitry is used in a load sensing mode of operation.

BACKGROUND

Driver circuitry for driving loads such as audio transducers (e.g. speakers) or haptic transducers (e.g. actuators such as linear resonant actuators) often includes auxiliary sense circuitry for sensing or monitoring of the load. For example, driver circuitry may include voltage detection (VMON) and current detection (IMON) circuit blocks, for detecting, respectively, a voltage across the load and a current through the load while the transducer is being driven by a playback signal such as an audio signal or a haptic waveform. In this context, a playback signal is a drive signal that drives the transducer to generate a desired output such as an audio or haptic output.

The detected voltage and current can be used to calculate, measure, estimate or otherwise determine an impedance of the transducer, which may be a complex impedance having resistive, inductive and/or capacitive components. Determining the complex impedance may involve measuring, estimating or otherwise determining a real (resistive) part and an imaginary (inductive) part of the complex impedance separately. The determined impedance may be used in applications such as speaker protection while the playback signal is being provided to the transducer, or to estimate a position of a moving mass of an actuator.

SUMMARY

According to a first aspect, the invention provides circuitry for driving a load, the circuitry comprising:
  driver circuitry;
  load sensing circuitry; and
  a parameter estimation engine,
  wherein the circuitry is operable in:
  a driving mode of operation in which the driver circuitry supplies a drive signal to a load coupled to the circuitry; and
  a load sensing mode of operation, for estimating a characteristic of a load coupled to the circuitry based on a signal output by the load sensing circuitry in response to a stimulus signal supplied to the driver circuitry, and
  wherein the circuitry is operable to perform a calibration operation in which the parameter estimation engine generates a circuit parameter for use in the load sensing mode based, at least in part, on a signal generated by the circuitry in response to a calibration stimulus signal supplied to the driver circuitry.

The characteristic of the load may be an impedance of the load.

The load sensing circuitry may comprise:
  a voltage monitoring path for monitoring a voltage across the load; and
  a current monitoring path for monitoring a current through the load.

The current monitoring path may comprise variable gain current sense amplifier circuitry configured to generate a current sense signal indicative of a current through the load.

The voltage monitoring path may comprise variable gain voltage sense amplifier circuitry configured to generate a voltage sense signal indicative of a voltage across the load.

The driver circuitry may be coupled to a first load terminal of the circuitry.

The circuitry may further comprise common mode buffer circuitry configured to supply a common mode signal to a second load terminal of the circuitry via a common mode signal path during the calibration operation and in the load sensing mode of operation.

The common mode signal path may comprise a variable current sense resistor.

The second variable gain amplifier circuitry may be coupled to the variable current sense resistor.

The circuitry may further comprise first peak detector circuitry coupled to an output of the first variable gain amplifier circuitry and first comparator circuitry configured to output a signal to the parameter estimation engine if the signal output by the first peak detector circuitry meets a first predefined threshold.

The circuitry may further comprise second peak detector circuitry coupled to an output of the second variable gain amplifier circuitry and second comparator circuitry configured to output a signal to the parameter estimation engine if the signal output by the second peak detector circuitry meets a second predefined threshold.

The circuitry may further comprise:
  third peak detector circuitry coupled to an output of the common mode buffer circuitry; and
  third comparator circuitry configured to output a signal to the parameter estimation engine if the signal output by the third peak detector circuitry meets a third predefined threshold.

The circuitry may further comprise:
  trough detector circuitry coupled to an output of the common mode buffer circuitry; and
  fourth comparator circuitry configured to output a signal to the parameter estimation engine if the signal output by the trough detector circuitry falls below a fourth predefined threshold.

The circuit parameter may comprise one or more of:
  an amplitude and/or frequency of the stimulus signal to be supplied to the driver circuitry for operation of the circuitry in its load sensing mode;
  a phase of the stimulus signal to be supplied to the driver circuitry for operation of the circuitry in its load sensing mode;
  a resistance of a variable current sense resistor of the load sensing circuitry;
  a frequency response of analog front end (AFE) circuitry of the load sensing circuitry;
  a conversion time of analog to digital converter (ADC) circuitry of the AFE circuitry;
  a closed loop gain of a PWM modulator of the driver circuitry;
  a reference voltage for common mode buffer circuitry;
  a feedback network of the common mode buffer circuitry;
  a gain of variable gain current sense amplifier circuitry and/or a gain of variable gain voltage sense amplifier circuitry of the load sensing circuitry; and
  a gain of the ADC circuitry of the AFE circuitry.

The parameter estimation engine may comprise processing circuitry.

The parameter estimation circuitry may comprise one or more of:
- a look up table;
- a state machine; and
- a trained machine learning module.

The circuitry may be configured to perform the calibration operation on start-up of the circuitry and/or periodically during operation of the circuitry and/or in response to a recalibration command or signal.

According to a second aspect the invention provides an integrated circuit comprising circuitry according to the first aspect.

According to a third aspect there is provided a host device comprising circuitry according to the first aspect.

The host device may comprise a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console a VR or AR device, a mobile telephone, a portable audio player or other portable device.

BRIEF DESCRIPTION OF THE DRAWINGS

Embodiments of the invention will now be described, strictly by way of example only, with reference to the accompanying drawings, of which:

FIG. 3 is a graphical representation showing a determination of a maximum excursion of a transducer.

DETAILED DESCRIPTION

Figure 1:
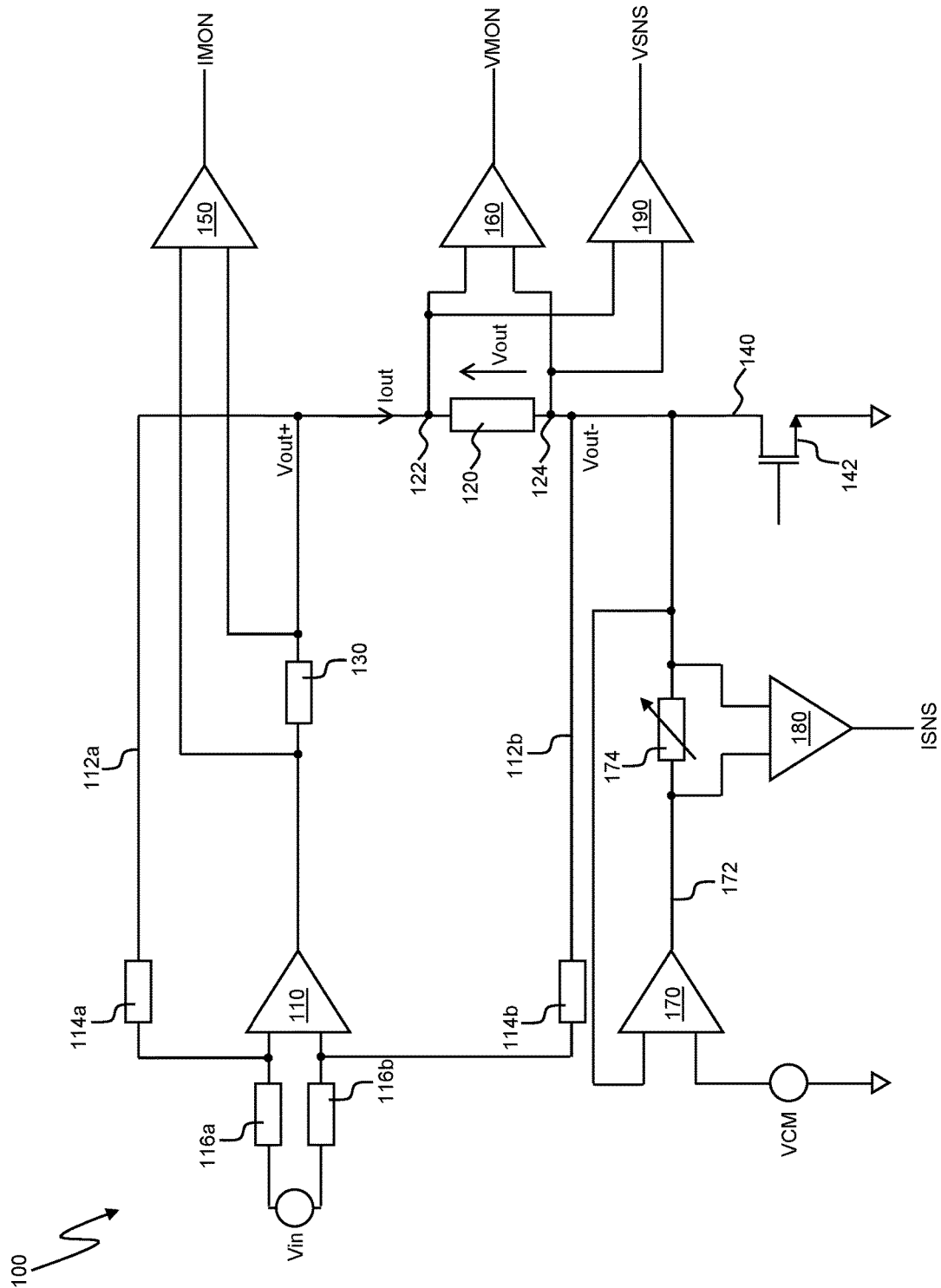
FIG. 1 is a schematic diagram showing an example of circuitry that includes load sensing circuitry.

FIG. 1 is a schematic diagram showing an example of circuitry that includes load sensing circuitry comprising voltage and current monitoring paths for monitoring, respectively, a voltage across a load and a current through the load during operation of the circuitry to drive the load.

The circuitry, which may be implemented as an integrated circuit (IC), is shown generally at 100 in FIG. 1. The circuitry 100 includes driver circuitry 110 configured to receive an input signal and to output a drive signal for driving a load 120, which is external to the circuitry (e.g. the load is provided off-chip, in examples in which the circuitry 100 is implemented as an IC). The load 120 may be an inductive load such as an audio transducer (e.g., a speaker), or a haptics transducer or actuator (e.g., a linear resonant actuator).

The driver circuitry 110 in the illustrated example comprises differential amplifier circuitry and may be implemented, for example, as Class A, Class AB or Class D amplifier circuitry. An output of the driver circuitry 110 is coupled, via a current sense resistor 130, to a first load terminal 122. A second load terminal 124 is coupled, via a return path 140 comprising a return path switch 142, to ground (or some other reference voltage supply). In use of the circuitry 100, a first terminal of the external load 120 is coupled to the first load terminal 122, and a second terminal of the external load 120 is coupled to the second load terminal 124. Thus, in use of the circuitry 100 the external load 120 is coupled in series between the current sense resistor 130 and ground (or some other reference voltage supply).

A first feedback path 112a comprising a first feedback resistor 114a is provided between the first load terminal 122 and a first input of the driver circuitry 110. A second feedback path 112b comprising a second feedback resistor 114b is provided between the second load terminal 124 and a second input of the driver circuitry 110. First and second input resistors 116a, 116b are coupled to the first and second inputs, respectively, of the driver circuitry 110. A differential input signal pair Vin is supplied to the first and second inputs of the driver circuitry 110 via the first and second input resistors 116a, 116b.

Inputs of a current monitor amplifier 150 are coupled to first and second terminals of the current sense resistor 130, such that in use of the circuitry 100 in a driving or playback mode of operation the current monitor amplifier 150 generates a signal (e.g. a voltage) IMON at its output that is indicative of a current through the load 120.

Inputs of a voltage monitor amplifier 160 are coupled to the first and second load terminals 122, 124 of the circuitry, such that in use of the circuitry 100 in the driving or playback mode of operation the voltage monitor amplifier 160 generates a signal (e.g. a voltage) VMON at its output that is indicative of a voltage across the load 120.

The circuitry further includes common mode buffer circuitry 170, which is configured to output a common mode voltage VCM to the return path 140 during operation of the circuitry 100 in a load sensing mode of operation. An output of the common mode buffer circuitry 170 thus coupled to the return path 140 by a common mode signal path 172 that includes a variable current sense resistor 174. The variable current sense resistor 174 is thus coupled in series with the external load 120.

Inputs of a current sense amplifier 180 are coupled to first and second terminals of the variable current sense resistor 174, such that in use of the circuitry 100 in the load sensing mode the current sense amplifier 180 generates a signal (e.g. a voltage) ISNS indicative of a current through the external load 120.

Inputs of a voltage sense amplifier 190 are coupled to the first and second load terminals 122, 124, such that in use of the circuitry 100 in the load sensing mode the voltage sense amplifier 190 generates a signal (e.g. a voltage) VSNS indicative of a voltage across the external load.

In operation of the circuitry 100 in the driving or playback mode of operation, the return path switch 142 is closed, thus coupling the output of the driver circuitry 110 to ground (or some other reference voltage) via the current sense resistor 130 and the external load 120. The common mode buffer circuitry 170 is switched off or otherwise disabled.

Thus, a voltage Vout—at the second load terminal 124 is equal to 0 v (assuming that the reference voltage is ground). A driving waveform is supplied to the driver circuitry 110, which in turn outputs a drive signal to the load 120.

The voltage monitor amplifier 160 generates a signal (e.g. a voltage) VMON indicative of the voltage that develops across the load 120 as a result of the drive signal supplied to the load 120 by the driver circuitry 110, and the current monitor amplifier 150 generates a signal (e.g. a voltage) IMON indicative of the current through the load 120 as a result of the drive signal.

The VMON and IMON signals may be digitised by suitable analog to digital converter (ADC) circuitry (not shown in FIG. 1), and the VMON and IMON signals (or their digital versions) can be used by downstream processing circuitry (not shown) to calculate, estimate or otherwise determine the complex impedance of the load 120 for the drive signal that has been supplied to it by the driver circuitry 110. The complex impedance so determined may be used, for example, to estimate an excursion of the load (e.g. where the load 120 is an audio transducer such as a speaker), or to estimate a position of a moving mass of the load 120 (e.g. where the load is an actuator such as a linear resonant actuator).

In operation of the circuitry 100 in a load sensing mode of operation, the return path switch 142 is opened, thus decoupling the load 120 from the ground or other reference voltage. The common mode buffer circuitry 170 is switched on, to supply the common mode voltage VCM to the second load terminal 124.

Thus, a voltage Vout—at the second load terminal 124 is equal to VCM. A stimulus waveform of a known frequency or frequency range fsns and a known amplitude is supplied to the driver circuitry 110, which in turn supplies a stimulus signal to the load 120.

The voltage sense amplifier 190 generates a signal (e.g. a voltage) VSNS indicative of the voltage that develops across the load 120 as a result of the stimulus signal supplied to the load 120 by the driver circuitry 110, and the current sense amplifier 180 generates a signal (e.g. a voltage) ISNS indicative of the current through the load 120 as a result of the stimulus signal.

The VSNS and ISNS signals may be digitised by suitable analog to digital converter (ADC) circuitry (not shown in FIG. 1), and the VSNS and ISNS signals (or their digital versions) can used by the downstream processing circuitry shown to calculate, estimate or otherwise determine the complex impedance of the load 120 at the frequency or frequency range fsns. To facilitate accurate determination of the impedance of the load 120, the VSNS and ISNS signals may have identical gain and phase profiles, to avoid any gain or phase mismatch between the VSNS and ISNS signals that could introduce error into the real part or the imaginary part of the determined load impedance.

In operation of the circuitry 100 in the load sensing mode of operation, a voltage Vout across the load 120 and a current Iout through the load are both fixed when the stimulus signal of frequency fsns is supplied, to avoid any noticeable change in the load impedance during a load impedance sensing operation.

The voltage Vout is preferably maximised for a particular load 120 to maximise the current through the load 120, so as to maximise or at least increase a signal to noise ratio (SNR) of signal paths to the downstream processing circuitry for both the VSNS signal and the ISNS signal. In order to maximise Vout and Iout it is desirable for the impedance of the load 120 to be known at the frequency fsns (or across the frequency range fsns).

Similarly, the resistance of the variable current sense resistor 174 and the gain of the signal paths for the VSNS and ISNS signals are preferably maximised to maximise or at least increase the SNR VSNS and ISNS signals. Again, to maximise these parameters it is desirable for the impedance of the load 120 to be known at the frequency fsns (or across the frequency range fsns).

If the driver circuitry 110 comprises Class D amplifier circuitry with a switching frequency of Fpwm, then the common mode voltage VCM is preferably minimised to prevent or limit any DC current flowing though the load 120 and thereby minimise any change in the voltage at the inputs of the current monitor amplifier 150, voltage monitor amplifier 160, current sense amplifier 180 and/or voltage sense amplifier 190 at switching frequencies.

The manufacturer-specified impedance and other parameters of the load 120 are subject to variation, e.g., as a result of manufacturing tolerances, ageing and environmental factors such as local temperature and the like, and so the specified impedance of the load 120 is not a reliable indication of the actual impedance of the load 120. Accordingly, the impedance of the load 120 may need to be measured. However, measuring the impedance and/or other parameters of the load during production of a host device incorporating the circuitry 100 and the load 120 would require test time during production, and once the parameters of the load 120 are known, the various parameters of the circuitry discussed above may need to be manually selected and/or optimised, which further increases the time required for testing and calibration of the circuitry 100 during production.

Thus a desire exists for a system that is able to adapt to load whose parameters (e.g. impedance) are not known, to avoid the need for excessive testing, characterisation and calibration during production.

Figure 2:
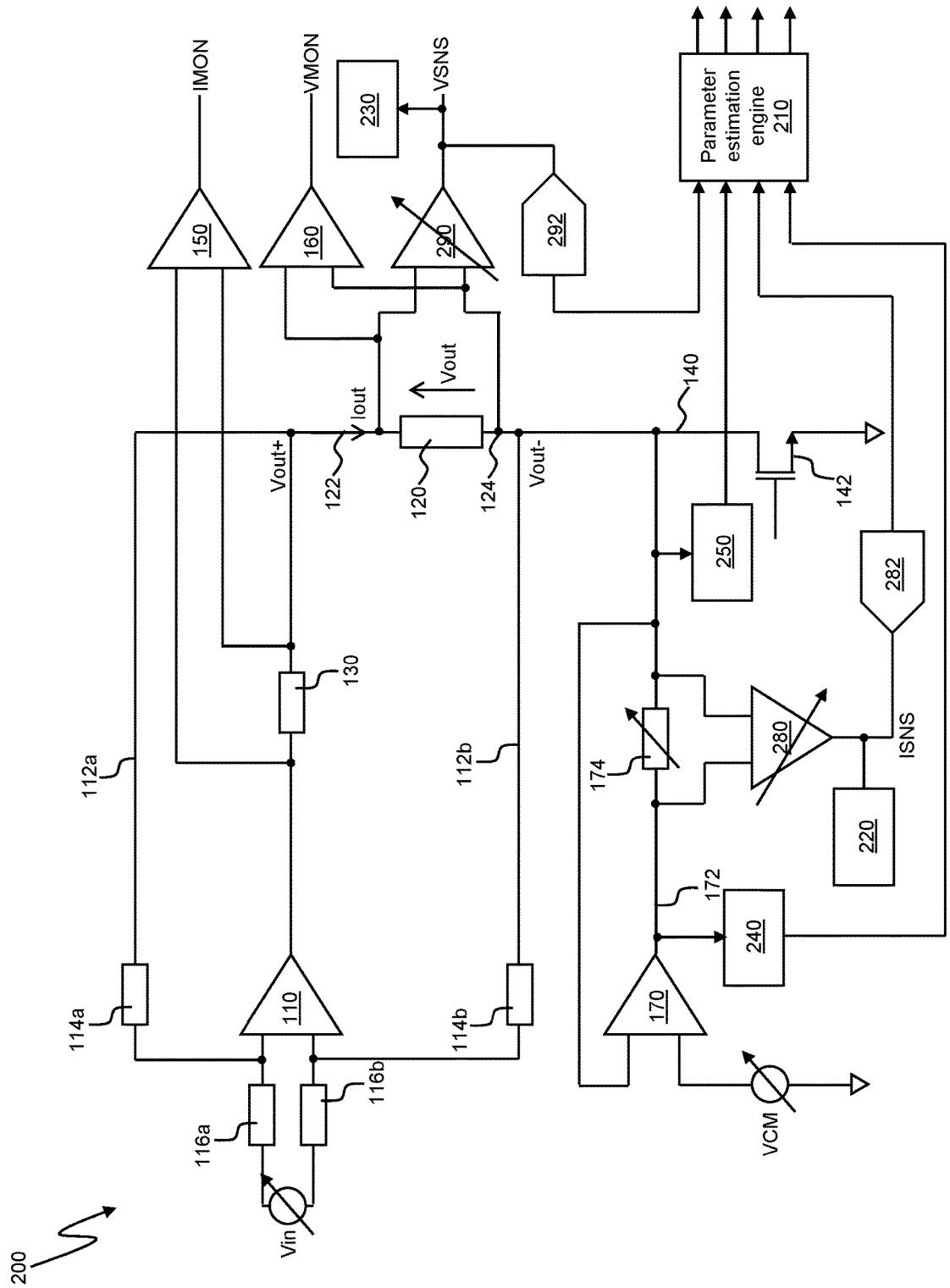
FIG. 2 is a is a schematic representation of circuitry according to the present disclosure which is capable of performing automatic setting and/or optimisation of system parameters without a priori information about the parameters of a load.

FIG. 2 is a schematic representation of circuitry according to the present disclosure which is capable of performing automatic setting and/or optimisation of system parameters without a priori information about the parameters of a load.

The circuitry, shown generally at 200 in FIG. 2, includes a number of features in common with the circuitry 100 of FIG. 1. Such common features are denoted by common reference numerals in FIGS. 1 and 2, and will not be described again in detail here.

Like the circuitry 100, the circuitry 200 is operable in both a driving or playback mode of operation and in a load sensing mode of operation. As the present disclosure pertains only to the load sensing mode of operation, only those elements of the circuitry 200 that are relevant to that mode are discussed here. It is to be understood, however, that the circuitry 200 includes additional load sensing elements including a current sense resistor 130 and voltage and current monitor amplifiers 150, 160 of the kind described in relation to FIG. 1 for use in the driving or playback mode of operation.

The circuitry 200 includes a parameter estimation engine 210, having inputs that are coupled to various nodes of the circuitry 200, as described in more detail below. The parameter estimation engine 210 is operable during a self-calibration operation (which may occur, for example, on initial power up of the circuitry 200 and/or periodically during operation of the circuitry 200, and/or in response to a specific recalibration command) to receive signals from the various nodes of the circuitry 200, in response to a stimulus signal of known frequency (or frequency range) and to determine and/or optimise, based on the received signals, parameters of various elements of the circuitry 200 and/or parameters of the stimulus signal. These parameters may then be used by the circuitry 200 during subsequent operation of the circuitry 200 in its load sensing mode.

Thus the circuitry 200 of FIG. 2 is able to determine system parameters for use during load sensing operations for load 120 whose parameters (e.g. impedance) are not known, without requiring any test time during production.

The circuitry 200 includes current sense analog front end (AFE) circuitry comprising a variable gain current sense amplifier 280 and first ADC circuitry 282. The variable gain current sense amplifier 280 has inputs that are coupled to first and second terminals of the variable current sense resistor 174, such that in use of the circuitry 200 in the load sensing mode the variable gain current sense amplifier 280 generates a current sense signal (e.g. a voltage) ISNS indicative of a current through the external load 120.

An output of the variable gain current sense amplifier 280 is coupled to an input of the first ADC circuitry 282, and an output of the first ADC circuitry 282 is coupled to a first input of the parameter estimation engine 210, such that the parameter estimation engine 210 receives digital version of the ISNS signal from the first ADC circuitry 282.

A first peak detector and comparator circuitry block 220 may be provided, having an input coupled to the output of the variable gain current sense amplifier 280 and an output coupled to another input of the parameter estimation engine 210. Comparator circuitry of the first peak detector and comparator circuitry block 220 may be provided or supplied with a first predefined threshold value to which the signal output by peak detector circuitry of the first peak detector and comparator circuitry block 220 is compared. If a detected peak magnitude of the ISNS signal output by the variable gain current sense amplifier 280 exceeds the first predefined threshold value, an output of the comparator circuitry changes, e.g. from a relatively low voltage level (e.g. 0 v) to a relatively high voltage level.

The first peak detector and comparator circuitry block 220 may provide a low latency output signal to the parameter estimation engine 210. As the first ADC circuitry 282 may be relatively slow, or may be unable to output an accurate value for the detected current through the load 120 due to clipping, the signal output by the first peak detector and comparator circuitry block 220 may be used instead of, or in addition to, the digital version of the ISNS signal, by the parameter estimation engine 210.

The circuitry 200 further includes voltage sense analog front end (AFE) circuitry comprising a variable gain voltage sense amplifier 290 and second ADC circuitry 292. The variable gain voltage sense amplifier 290 has inputs that are coupled to the first and second load terminals 122, 124, such that in use of the circuitry 200 in the load sensing mode the variable gain voltage sense amplifier 290 generates a voltage sense signal (e.g. a voltage) VSNS indicative of a voltage across the external load 120.

An output of the variable gain voltage sense amplifier 290 is coupled to an input of the second ADC circuitry 292, and an output of the second ADC circuitry 292 is coupled to a second input of the parameter estimation engine 210, such that the parameter estimation engine 210 receives digital version of the VSNS signal from the second ADC circuitry 292.

A second peak detector and comparator circuitry block 230 may be provided, having an input coupled to the output of the variable gain voltage sense amplifier 290 and an output coupled to another input of the parameter estimation engine 210. Comparator circuitry of the second peak detector and comparator circuitry block 230 may be provided or supplied with a second predefined threshold value to which the signal output by peak detector circuitry of the second peak detector and comparator circuitry block 230 may be compared. If a detected peak magnitude of the VSNS signal output by the variable gain voltage sense amplifier 290 exceeds the second predefined threshold value, an output of the comparator circuitry changes, e.g. from a relatively low voltage level (e.g. 0 v) to a relatively high voltage level.

The second peak detector and comparator circuitry block 230 may provide a low latency output signal to the parameter estimation engine 210. As the second ADC circuitry 292 may be relatively slow, or may be unable to output an accurate value for the detected voltage across the load 120 due to clipping, the signal output by the second peak detector and comparator circuitry block 230 may be used instead of, or in addition to, the digital version of the VSNS signal, by the parameter estimation engine 210.

The circuitry 200 further includes a trough detector and comparator circuitry block 240 having an input coupled to the output of the common mode buffer circuitry 170. An output of the trough detector and comparator block 240 is coupled to a third input of the parameter estimation engine 210. Comparator circuitry of the trough detector and comparator circuitry block 240 may be provided or supplied with a third predefined threshold value to which the signal output by trough detector circuitry of the trough detector and comparator circuitry block 240 may be compared. If a detected minimum in a magnitude of the common mode signal output by the common mode buffer circuitry 170 falls below the third predefined threshold value, an output of the comparator circuitry changes, e.g. from a relatively low voltage level (e.g. 0 v) to a relatively high voltage level.

The circuitry 200 further includes a third peak detector and comparator circuitry block 250 having an input coupled to the common mode signal path downstream of the variable current sense resistor 174. An output of the third peak detector and comparator circuitry block 250 is coupled to a fourth input of the parameter estimation engine 210. Comparator circuitry of the third peak detector and comparator circuitry block 250 may be provided or supplied with a fourth predefined threshold value to which the signal output by peak detector circuitry of the third peak detector and comparator circuitry block 250 may be compared. If a detected peak magnitude of the signal in the common mode signal path 162 exceeds the fourth predefined threshold value, an output of the comparator circuitry changes, e.g. from a relatively low voltage level (e.g. 0 v) to a relatively high voltage level.

During the self-calibration operation, a calibration stimulus signal of known amplitude and frequency (or frequency range) is supplied to the driver circuitry 110. The return path switch 142 is switched off, and the common mode buffer circuitry 170 is switched on to provide a common mode signal to the second load terminal 124.

The parameter estimation engine 210 receives, as inputs thereto, signals output by the first and second ADC circuitry 282, 292, the trough detector and comparator circuitry block 240 and the third peak detector and comparator circuitry block 250 in response to the applied stimulus signal. If the first and second peak detector and comparator circuitry blocks 220, 230 are provided the parameter estimation engine 210 may also receive signals output by these blocks in response to the applied stimulus signal.

Based on these inputs, and/or on additional metrics or statistics calculated or otherwise determined by the parameter estimation engine 210 (e.g. noise statistics generated by the parameter estimation engine by determining a ratio of VSNS to ISNS and analysing noise levels), the parameter estimation engine 210 can select and/or optimise one or more parameters of the circuitry 200 and/or the stimulus signal for use during operation of the circuitry 200 in a subsequent load sensing operation.

These parameters may include at least one of:
an amplitude and/or frequency of the stimulus signal Vin supplied to the driver circuitry 110 during the subsequent load sensing operation;
a phase of the stimulus signal, to achieve the best settling and/or highest accuracy in the conversion time available at the ADC circuitry 282,292 of the voltage sense and/or current sense AFE circuitry;

a resistance of the variable current sense resistor 174, to maximises a signal to noise ratio;

a frequency response of the voltage sense AFE circuitry and/or a frequency response of the current sense AFE circuitry, to maximise or increase rejection or attenuation of the switching frequency Fpwm used by the driver circuitry 110 (if implemented as Class D amplifier circuitry);

a conversion time of the ADC circuitry 282,292 of the voltage sense and/or current sense AFE circuitry;

a closed loop gain of a PWM modulator of the driver circuitry 110;

a reference voltage for the common mode buffer circuitry 170;

a feedback network of the common mode buffer circuitry 170;

a gain of the variable gain current sense amplifier 280 and/or a gain of the variable gain voltage sense amplifier 290; and a gain of the first ADC circuitry 282 of the current sense AFE circuitry and/or a gain of the second ADC circuitry 292 of the voltage sense AFE circuitry.

The selection and/or optimisation of parameters by the parameter estimation engine 210 may ensure that clipping of the stimulus signal during a load sensing operation is avoided, and/or that manufacturer defined safe operating area (SOA) conditions for the load 120 (e.g., maximum voltage and current conditions) are complied with during operation of the circuitry 200, and/or that ageing of the load 120 is not artificially accelerated.

The parameter estimation engine 210 may comprise processing circuitry implementing a look-up table or a state machine, and may be configured to select one or more parameters for the circuitry 200 based on the signals received at the inputs of the parameter estimation engine 210 during the self-calibration operation. For example, the parameter estimation engine may comprise a look-up table containing a plurality of different values for the parameters described above, each different parameter value corresponding to a different input signal value, such that the parameter estimation engine can select the parameter value that corresponds to a given input signal value to be applied to the relevant element of the circuitry 200.

Additionally or alternatively, the parameter estimation engine 210 may comprise a machine learning module that is trained to output an optimal configuration of parameters (e.g. a value of one or more of the parameters described above) for the circuitry 200, based on the inputs to the parameter estimation engine 210.

The selected parameter may be applied in a feedback manner, e.g. by adjusting a feedback loop, and/or in a feedforward manner, e.g. based on a predetermined equation.

For example, to apply a selected gain value to the variable gain current sense amplifier 280 and/or the variable gain voltage sense amplifier 290, a feedback loop of the amplifier 280/290 may be adjusted.

Once suitable parameter values have been applied to the relevant elements of the circuitry 200 as a result of the self-calibration operation, the circuitry 200 may be used in its load sensing mode to estimate a characteristic of the load 120.

As an example, the complex impedance of the load 120 may be determined, based on the VSNS and ISNS signals output by the variable gain current sense amplifier 280 and the variable gain voltage sense amplifier circuitry 290 in response to the application of a stimulus signal Vin of known amplitude and frequency or frequency range fsns to the inputs of the driver circuitry 110.

In one example where the load 120 is a transducer such as a speaker or actuator, the imaginary part of the complex impedance of the load 120, representing the inductance of the load 120, may be monitored as the amplitude of the stimulus is adjusted over time, in order to estimate or determine a maximum excursion of the transducer. The inductance of the load at the maximum excursion may be recorded, and subsequently used during operation of the circuitry 200 in its driving or playback mode to provide an estimate of the excursion of the transducer as a percentage of the maximum excursion.

FIG. 3 is a graphical representation of the relationship between the amplitude of a drive signal supplied to a load 120 and the inductance of the load 120, as represented by the imaginary part of the complex impedance.

As can be seen, there is an approximately linear relationship between the amplitude of the drive signal and the inductance of the load in a first region 310, for drive signal amplitudes between −V1 and +V1. At a point 312 the rate of change of inductance with increasing drive signal amplitude begins to slow, and this point can be regarded as representing the maximum excursion of the transducer. An inductance 11 of the transducer at the point 312 of maximum excursion may be recorded.

During subsequent use of the circuitry 200 in its driving or playback mode of operation, a driving waveform is supplied to the driver circuitry 110, which in turn outputs a drive signal to the load 120, as described above with reference to FIG. 1. The inductance of the load 120 may be determined, based on the IMON and VMON signals output by the current monitor amplifier 150 and voltage monitor amplifier 160 respectively.

A value for the excursion of the transducer as a percentage of the maximum excursion may then be calculated (e.g. by the downstream processing circuitry) by dividing the determined inductance by the recorded inductance 11 of the transducer at the point of maximum excursion. This percentage of maximum excursion value may be used for a variety of purposes, e.g. in a speaker protection system to prevent over-excursion of the transducer, or to determine a position of a moveable mass of an actuator.

As will be apparent from the foregoing discussion, the circuitry 200 of the present disclosure is able to determine, during the self-calibration operation, suitable circuit and stimulus signal parameters to be applied during operation in the load sensing mode, without a priori knowledge of any parameter (e.g. an impedance) of the load. Thus, the test and calibration time for the circuitry during production is reduced, without affecting the ability of the circuitry to estimate accurately parameters such as an impedance of the load.

The circuitry described above with reference to the accompanying drawings may be incorporated in a host device such as a laptop, notebook, netbook or tablet computer, a gaming device such as a games console or a controller for a games console, a virtual reality (VR) or augmented reality (AR) device, a mobile telephone, a portable audio player or some other portable device, or may be incorporated in an accessory device for use with a laptop, notebook, netbook or tablet computer, a gaming device, a VR or AR device, a mobile telephone, a portable audio player or other portable device.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for driving a load, the circuitry comprising:
   driver circuitry;
   load sensing circuitry; and
   a parameter estimation engine,
       wherein the circuitry is operable in:
           a driving mode of operation in which the driver circuitry supplies a drive signal to a load coupled to the circuitry; and
           a load sensing mode of operation, for estimating a characteristic of a load coupled to the circuitry based on a signal output by the load sensing circuitry in response to a stimulus signal supplied to the driver circuitry, and
       wherein the circuitry is operable to perform a calibration operation in which the parameter estimation engine generates a circuit parameter for use in the load sensing mode based, at least in part, on a signal generated by the circuitry in response to a calibration stimulus signal supplied to the driver circuitry.

2. Circuitry according to claim 1, wherein the characteristic of the load is an impedance of the load.

3. Circuitry according to claim 1, wherein the load sensing circuitry comprises:
   a voltage monitoring path for monitoring a voltage across the load; and
   a current monitoring path for monitoring a current through the load.

4. Circuitry according to claim 3, wherein:
   the current monitoring path comprises variable gain current sense amplifier circuitry configured to generate a current sense signal indicative of a current through the load; and
   the voltage monitoring path comprises variable gain voltage sense amplifier circuitry configured to generate a voltage sense signal indicative of a voltage across the load.

5. Circuitry according to claim 4, wherein the driver circuitry is coupled to a first load terminal of the circuitry, and wherein the circuitry further comprises common mode buffer circuitry configured to supply a common mode signal to a second load terminal of the circuitry via a common mode signal path during the calibration operation and in the load sensing mode of operation.

6. Circuitry according to claim 5, wherein the common mode signal path comprises a variable current sense resistor, and wherein the second variable gain amplifier circuitry is coupled to the variable current sense resistor.

7. Circuitry according to claim 4, wherein the circuitry further comprises first peak detector circuitry coupled to an output of the first variable gain amplifier circuitry and first comparator circuitry configured to output a signal to the parameter estimation engine if the signal output by the first peak detector circuitry meets a first predefined threshold.

8. Circuitry according to claim 4, wherein the circuitry further comprises second peak detector circuitry coupled to an output of the second variable gain amplifier circuitry and second comparator circuitry configured to output a signal to the parameter estimation engine if the signal output by the second peak detector circuitry meets a second predefined threshold.

9. Circuitry according to claim 5, wherein the circuitry further comprises:
   third peak detector circuitry coupled to an output of the common mode buffer circuitry; and
   third comparator circuitry configured to output a signal to the parameter estimation engine if the signal output by the third peak detector circuitry meets a third predefined threshold.

10. Circuitry according to claim 5, wherein the circuitry further comprises:
    trough detector circuitry coupled to an output of the common mode buffer circuitry; and
    fourth comparator circuitry configured to output a signal to the parameter estimation engine if the signal output by the trough detector circuitry falls below a fourth predefined threshold.

11. Circuitry according to claim 1, wherein the circuit parameter comprises one or more of:
    an amplitude and/or frequency of the stimulus signal to be supplied to the driver circuitry for operation of the circuitry in its load sensing mode;
    a phase of the stimulus signal to be supplied to the driver circuitry for operation of the circuitry in its load sensing mode;
    a resistance of a variable current sense resistor of the load sensing circuitry;
    a frequency response of analog front end (AFE) circuitry of the load sensing circuitry;
    a conversion time of analog to digital converter (ADC) circuitry of the AFE circuitry;
    a closed loop gain of a PWM modulator of the driver circuitry;
    a reference voltage for common mode buffer circuitry;
    a feedback network of the common mode buffer circuitry;
    a gain of variable gain current sense amplifier circuitry and/or a gain of variable gain voltage sense amplifier circuitry of the load sensing circuitry; and
    a gain of the ADC circuitry of the AFE circuitry.

12. Circuitry according to claim 1, wherein the parameter estimation engine comprises processing circuitry.

13. Circuitry according to claim 12, wherein the parameter estimation circuitry comprises one or more of:
    a look up table;
    a state machine; and
    a trained machine learning module.

14. Circuitry according to claim 1, wherein the circuitry is configured to perform the calibration operation on start-up of the circuitry and/or periodically during operation of the circuitry and/or in response to a recalibration command or signal.

15. An integrated circuit comprising circuitry according to claim 1.

16. A host device comprising circuitry according to claim 1.

17. A host device according to claim 16, wherein the host device comprises a laptop, notebook, netbook or tablet computer, a gaming device, a games console, a controller for a games console, a virtual reality (VR) or augmented reality (AR) device, a mobile telephone, a portable audio player, a portable device, an accessory device for use with a laptop, notebook, netbook or tablet computer, a gaming device, a games console a VR or AR device, a mobile telephone, a portable audio player or other portable device.

* * * * *